(12) United States Patent
Tirapu-Azpiroz et al.

(10) Patent No.: US 8,458,626 B1
(45) Date of Patent: Jun. 4, 2013

(54) METHOD FOR CALIBRATING AN SRAF PRINTING MODEL

(75) Inventors: Jaione Tirapu-Azpiroz, Rio de Janeiro (BR); Ramya Viswanathan, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/354,481

(22) Filed: Jan. 20, 2012

(51) Int. Cl.
*G06F 17/50* (2006.01)

(52) U.S. Cl.
USPC ............................................................ 716/54

(58) Field of Classification Search
USPC .................................................... 716/100, 54
See application file for complete search history.

(56) References Cited

U.S. PATENT DOCUMENTS

| | | | |
|---|---|---|---|
| 7,016,017 B2 * | 3/2006 | Hansen | 355/67 |
| 7,030,966 B2 * | 4/2006 | Hansen | 355/67 |
| 7,245,356 B2 * | 7/2007 | Hansen | 355/67 |
| 2004/0156030 A1 * | 8/2004 | Hansen | 355/67 |
| 2004/0158808 A1 * | 8/2004 | Hansen | 716/21 |
| 2006/0126046 A1 * | 6/2006 | Hansen | 355/55 |
| 2011/0029937 A1 * | 2/2011 | Kodera et al. | 716/52 |
| 2011/0209107 A1 * | 8/2011 | Kodera et al. | 716/55 |
| 2012/0042291 A1 * | 2/2012 | Granik et al. | 716/55 |
| 2012/0117523 A1 * | 5/2012 | Hendrickx et al. | 716/55 |

OTHER PUBLICATIONS

Shieh, J. et al., "A Proposal for the Contact Hole Assist Feature Printing Checker in IML" Proc. SPIE (Apr. 2005) pp. 672-677, vol. 5853.
Word, J. et al., "Model-Based Prediction of Full-Chip SRAF Printability" Proc. SPIE (May 2004) pp. 1105-1111, vol. 5377.
Liu, P. et al., "Validation of a Fast and Accurate 3D Mask Model for SRAF Printability Analysis at 32 nm Node" Brion. Proc. SPIE (Oct. 30, 2007) pp. 67301R-1-67301R-8, vol. 6730.
Hung, C.Y. et al., "A Novel Approach for Full Chip SRAF Printability Check" Proc. SPIE (Mar. 20, 2006) pp. 615438-1-615438-7, vol. 6154.

* cited by examiner

*Primary Examiner* — Suchin Parihar
(74) *Attorney, Agent, or Firm* — Scully, Scott, Murphy & Presser, P.C.; Yuanmin Cai

(57) ABSTRACT

Printing risks for sub-lithographic assist features (SRAFs) can be predicted and minimized by employing an SRAF printing model, which is calibrated at a different image plane than an image plane at which a main feature model for predicting shapes of printed images of main features is calibrated. The optical model parameters of the main feature model and the SRAF printing model are calibrated separately such that the main feature model predicts the bottom CD and the SRAF printing model predicts the printing of SRAF features in a photoresist. Optionally, different degrees of printing risk can be assigned for different SRAF configurations.

20 Claims, 8 Drawing Sheets

METHOD FOR CALIBRATING AN SRAF PRINTING MODEL

BACKGROUND

The present disclosure relates to a method of providing a lithography model, and particularly to a method of calibrating a sub-lithographic assist feature (SRAF) printing model.

Images printed on a photoresist for an isolated lithographic pattern are more sensitive to focus variations than images for a dense lithographic pattern. Focus-exposure matrix (FEM) curves are thus more isofocal for dense lithographic patterns. Hence, dense lithographic patterns can be printed with a critical dimension (CD) that remains within tolerances for a broader range of defocus conditions.

Sub-resolution assist features (SRAFs) are added to mask shapes to create a denser environment for robust printing of main features. The SRAFs are not intended to be reproduced as distinct features in the photoresist, but they influence and modify the exact shape with which the main features are printed in the photoresist in the presence of the SRAFs relative to shapes that would be printed in the absence of the SRAFs. In order to avoid direct printing of the SRAFs, the size and location of the SRAFs need to be carefully optimized. If properly optimized, the SRAFs can provide benefit to the process performance of the lithographic process, for example, by increasing the depth of focus or process window, while avoiding direct printing of the SRAFs as separate but unintended patterns that could transfer to subsequent steps of the chip manufacturing process.

Optical proximity correction (OPC) photoresist models are calibrated to measurements of photoresist bottom critical dimensions (CDs) of fully resolved patterns. In case of dark field exposures where the features are trenches in the photoresist, the OPC models predict only the CDs at the bottom of the photoresist, and thus, cannot predict shallow indentation occurring at the top surface of the photoresist due to the presence of assist features in the mask. These unintended indentations induced by the presence of assist features can potentially transfer to the silicon substrate, and result in a failed chip. This shortcoming on the OPC models has become a significant yield detractor, particularly when employed with aggress inverse lithography or model based SRAF placement that rely on accurate prediction of the printing risk of SRAFs.

BRIEF SUMMARY

Printing risks for sub-lithographic assist features (SRAFs) can be predicted and minimized by employing an SRAF printing model, which is calibrated at a different image plane than an image plane at which a main feature model for predicting shapes of printed images of main features is calibrated. The optical model parameters of the main feature model and the SRAF printing model are calibrated separately such that the main feature model predicts the bottom CD and the SRAF printing model predicts the printing of SRAF features in a photoresist. Optionally, different degrees of printing risk can be assigned for different SRAF configurations.

According to an embodiment of the present disclosure, a method of calibrating a sub-resolution assist feature (SRAF) printing model is provided. The method includes: generating images of a patterned photoresist layer on a substrate, wherein the patterned photoresist layer has a photoresist top surface that exhibits surface indentation due to presence of SRAFs in a lithographic mask for at least one first combination of focus and dose conditions; calibrating an SRAF printing model against the images by determining a value for an SRAF printing best focus plane and by determining a value for an SRAF printing image plane, and calibrating a SRAF printing resist model; and applying the calibrated SRAF printing model to areas in a design pattern within the lithographic mask or another lithographic mask where SRAFs are present for at least one second combination of focus and dose conditions.

DETAILED DESCRIPTION

Figure 1A:
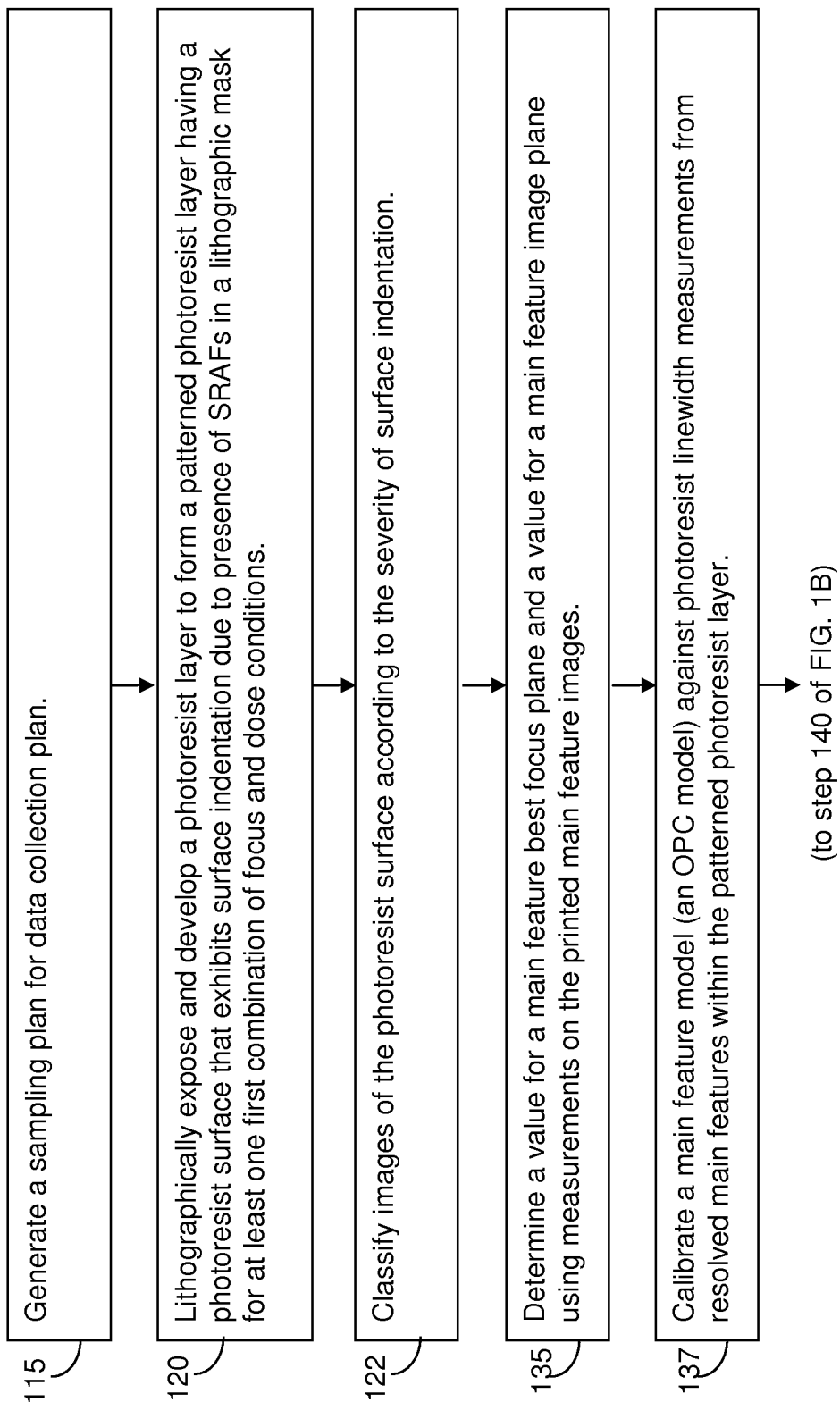
FIG. 1A is a first part of a flow chart illustrating a method for calibrating an SRAF printing model according to an embodiment of the present disclosure.

As stated above, the present disclosure relates to a method of calibrating a sub-lithographic assist feature (SRAF) printing model, which is now described in detail with accompanying figures. Like and corresponding elements mentioned herein and illustrated in the drawings are referred to by like reference numerals. The drawings are not necessarily drawn to scale.

As used herein, a "main feature" refers to a portion of the mask pattern that is intended for printing in a photoresist layer, i.e., intended for lithographically exposing the photoresist material on a wafer with sufficient illumination intensity to react with the photo-sensitive photoresist material. In the case of a photoresist layer including a positive photoresist material, the lithographically exposed portions of the photoresist layer become soluble to the developer solution and are removed when the developer is applied. A main feature is a resolvable feature that causes incident radiation to illuminate the photoresist with enough intensity so that the resolvable feature is developed away through the entire or nearly the entire thickness of the photoresist.

As used herein, a "sub-resolution assist feature (SRAF)" refers to a portion of the mask pattern that is intended to enhance the printing of a main feature without producing a physically manifested pattern in a photoresist layer that is printed as a result of the presence of the SRAF alone. The robustness of the main feature printing performance when affected by process variations such as focus or dose is enhanced by SRAFs. However, the intensity of the image of the SRAFS at the wafer plane is kept below the threshold for inducing a chemical reaction in the photoresist. Ideally, an image of an SRAF should not be present in an exposed photoresist layer in order to avoid impacting subsequent steps such as etch and deposition, and ultimately causing the manufactured chip to fail.

A design layout can be transferred from a lithographic mask to a photoresist layer coated on a substrate (i.e., a wafer) by etching design shapes on the lithographic mask, illuminating the lithographic mask with a radiation, and focusing the diffraction from the lithographic mask onto the photoresist layer via a system of lenses. To enhance resolution and robustness to focus deviations of the image intensity distribution on the photoresist layer, SRAFs are added to the lithographic mask as additional features or shapes. The SRAFs are not intended to be resolved in the photoresist layer. Shape and placement of the SRAFs must be optimized to provide the maximum benefit without resolving on the photoresist layer. Ideally, an SRAF should not even marginally resolve in the form of small indentations on the surface of the photoresist layer because even such small indentations could be transferred into the substrate in subsequent etch processes that employ the patterned photoresist layer as an etch mask.

As used herein, a "printing sub-resolution assist feature" or a "printing SRAF" refers to any visible indentation in a photoresist surface directly caused by the presence of an SRAF on the lithographic mask.

As used herein, a "dimpling" refers to a small depression or indentation on the photoresist surface that arise as a consequence of using mask patterns that are not intended to be resolved in the photoresist but that can produce a hollow perforation of the photoresist and this perforation is deemed detrimental to the lithographic process. This indentation occurs as the image intensity produced by this sub-resolution mask pattern marginally approaches the photoresist intensity threshold that triggers a chemical reaction that turns the photosensitive photoresist material soluble to the developer solution.

As used herein, a "lithography process model" or a "lithography model" is a set of equations that are numerically computed, comprising at least an optical model and a resist model. The optical model is applied first, to simulate the light diffracted by the lithographic photomask when illuminated by a monochromatic light source, and simulate how this diffracted light distribution is collected and imaged through the lithography tool optical system, comprising a system of lenses and/or mirrors, onto the wafer surface. The optical model is thus used to determine the light intensity distribution that is produced on the wafer surface by the lithography optical system. The photoresist model is used second, to compute, from that image intensity distribution, a photoresist topography remaining after a photoresist material chemically reacts to the image light intensity above a certain threshold to become soluble or insoluble, depending on photoresist polarity, to a developer solution, and is subsequently washed with said developer solution.

A lithography process model can include only a main feature lithography model or a set of a main feature lithography model and an SRAF printing model.

As used herein, an "optical model" refers to a model within a lithography process model and contains a set of equations that describe the illumination and diffraction from a lithographic mask, and the propagation and imaging onto the photoresist film of said diffracted light through the lithographic scanner system of lenses and/or mirrors.

An optical model computes the intensity distribution of the aerial image at the wafer plane. The computation of the intensity distribution of the aerial image at the wafer plane can be effected by employing the shapes on a lithographic mask, the configuration of the illuminating source, the projection optics design, and other parameters of the optical system such as numerical aperture which are fixed from the stepper/scanner.

A lithography simulator takes the mask shapes, i.e., the shapes within the lithographic mask, as inputs, and computes the light diffracted from the lithographic mask when it is illuminated by the source. The lithography simulator then computes using ray-tracing theory how the diffracted wavefront is directed through the complex lens system of the scanner towards the wafer surface. At the wafer surface, the lithography simulator computes the distribution of the image intensity inside the photoresist layer through the optical interference of all propagating rays collected by the numerical aperture of the optical system, ignoring any chemical effect inside the photoresist (since chemical effects are modeled by a photoresist model).

An optical model can be described as a set of equations and algorithms to numerically compute the diffraction from a lithographic mask, which may contain main features (resolvable features) and sub-resolution assist features, the propagation of the diffracted light field through the scanner projection lens system, and the aerial image the lens system projects onto a photoresist layer on a substrate, which can be a wafer as known in the art.

As used herein, a "main feature model," a "main feature process model," a "main feature lithography process model," an "optical proximity correction model," or an "OPC model" refers to a lithography process model that predicts photoresist contours corresponding to the presence of main features within a layout of a lithographic mask.

A main feature model predicts the photoresist contours at a single plane or height of the photoresist topography as seen from a top-down view. A main feature model can be used in full-chip compatible optical proximity correction algorithms. A main feature model can be compatible with simulations at a full-chip scale. A main feature model can be calibrated to, and aim to, predict the photoresist contours due to resolvable features of the layout.

Full-chip compatible main feature models are capable to predict the photoresist contours of resolvable features at a single photoresist plane with sufficient accuracy and sufficient speed that can be applied on an entire micro-chip layout with billions of patterns with adequately fast turn around time for chip manufacturing.

A main feature model can be used to apply corrections on mask shapes. The corrections pre-compensate for systematic and known distortions induced by the lithographic process employed to form final shapes that are printed on a photoresist on a wafer. The parameters for the lithographic process include optics and photoresist chemistry.

The distortions printed on the photoresist include effects of the optical system (such as diffraction and aberrations) and effects due to the chemistry of the photoresist (such as diffusion, acid reaction). A main feature model includes at least a pair of an optical model and a photoresist model that is used to compute the photoresist contours corresponding to the main feature. Hence, a main feature model is typically provided in two steps. First, an optical model is employed to simulate how light is diffracted from a mask and subsequently propagates through the imaging system of a scanner until the light is focused inside the photoresist layer. Second, a photoresist model is employed to simulate how the image intensity distribution inside the photoresist layer changes the chemistry of the photoresist material to produce topography with contours that resemble the target pattern. The aerial image is employed as an input for the photoresist model.

As used herein, "optical model parameters" refer to parameters in an optical model. The computation of the image intensity inside a photoresist layer requires information on the location of the best focus plane. In addition, each computation of critical dimension values or photoresist contours is done at a fixed height within the photoresist layer, resulting in a two-dimensional representation of the resist topography. Hence which horizontal plane is to be employed as the image or simulation plane needs to be determined.

Most of the parameters of the optical system (source, lens aberrations, and numerical aperture, etc.) are fixed by the stepper specifications. In some embodiments, the only parameters that need to be optimized or calibrated are the value of the best focus plane and the value of the image plane.

As used herein, a "best focus plane" or a "plane of best focus" is a parameter of an optical model and refers to the plane at which the image of the features on a lithographic mask is focused with maximum sharpness. The best focus plane can be defined relative to a photoresist top surface or a photoresist bottom surfaces, depending on the model conventions.

As used herein, an "image plane" or a "simulation plane" refers to a plane at which the computation of both the aerial image intensity and the photoresist topography contours in a lithography process model is performed. The computation is performed at one plane or height, which is an image plane, within the photoresist thickness at a time. In the case of OPC models, the photoresist contours are computed only at one plane or height within the photoresist thickness. Hence the value of the height of the image plane needs to be defined for the purpose of each computation.

As used herein, a "photoresist model" refers to the equation or set of equations describing the final photoresist topography contours after exposure by the image and development with a developer solution in any lithography process model, which can be a main feature model or an SRAF printing model.

A photoresist model predicts a physical structure of a photoresist. A photoresist model is derived from a physical, mechanistic description of the chemical response of a photoresist to light exposure and chemical development processes. In one embodiment of the present disclosure, the photoresist model can be employed to perform operations with a set of pre-defined basis functions on an aerial image, which is taken as an input for the photoresist model. These basis functions can use parameters that have been previously calibrated. Each operation can be, for instance, in the form of performing the convolution between the aerial image intensity distribution and a Gaussian function at every point of the aerial image over the simulation plane, where the standard deviation parameter of the Gaussian function has been previously determined during calibration. After that, all the results from said operations are combined together according to a predefined polynomial equation. Each term of this polynomial is the result of one of the operations performed on the aerial image with those basis functions, multiplied by a coefficient that has also been previously calibrated. The final result of applying this polynomial to the aerial image is a set of contours representing the top-down view of the developed photoresist topography.

As used herein, a constant threshold resist (CTR) model is a model of the photoresist chemical reaction to light and to the developer solution, where it is assumed that the photoresist response is uniform, highly localized with an stepwise development response to light intensity. In the case of a positive tone photoresist, every point in the photoresist exposed to light intensity above said threshold becomes soluble to the developer solution and will be removed by it.

As used herein, a "single photoresist model" refers to a photoresist model employing a single polynomial. In the single photoresist model, the selected basis functions and the set of calibrated polynomial coefficients and parameters are kept the same, even when the simulated aerial image is changed in focus and dose conditions. In other word, the same photoresist polynomial is applied to the aerial image resulting from changing focus and dose, producing results for different process conditions. The most common change applied to the aerial image is the change in the focus values. Changes in the numerical aperture, the source, or other optical components are possible.

As used herein, a "model form" refers to a form or structure of a polynomial with several terms, each containing a basis function that performs operations on the aerial image, the parameters of the operations, and multiplying coefficients that require calibration. For example, the operations on the aerial image can be a convolution of the aerial image with a Gaussian function, and the parameters can be a Gaussian standard deviation. A modeler can choose which basis functions to use in the photoresist model polynomial, and the resulting combination or resulting polynomial constitutes a model form.

As used herein, a "complex model form" is a model form in which a photoresist model polynomial is chosen with at least two terms (one more than a constant threshold). Often, a photoresist model polynomial in a complex model form includes three or more terms. The simplest terms include simple convolutions with Gaussian basis functions to model diffusion.

As used herein, a "complex photoresist model" is a photoresist model that employs a complex model form.

As used herein, a "focus" refers to the height of a wafer stage during lithographic exposure. A focus can be defined relative to the plane of best focus plane, which is the height of the wafer stage in the scanner at which the image and, therefore photoresist contours, are sharpest.

As used herein, a "dose" refers to the amount of energy exposed over a photoresist layer on a wafer, with energy being a function of the exposure time (i.e., energy=intensity×time). A dose can be defined relative to the value of a best dose, at which the photoresist line-widths are equal to the target linewidth value.

A lithographic process can be characterized by a combination of a focus and a dose values. This combination is also referred to as "focus and dose conditions," "exposure focus and dose conditions," or "lithographic exposure focus and dose conditions", or "lithographic exposure conditions."

As used herein, "nominal dose and focus conditions" refer to the combination of a nominal dose and a nominal focus that is known to be optimal for the purpose of replicating intended patterns from a lithographic mask on a photoresist layer.

As used herein, a "printing model" is a model for predicting whether a feature in a lithographic mask would be transferred to a photoresist layer under selected lithographic exposure conditions. A printing model can be embodied as a set of equations and methods of applying the set of equations such that the computed result is a prediction of whether a feature, which is present in a lithographic mask would be transferred into a photoresist layer or not. A printing model provides at least a binary result, i.e., presence or absence of a printed image. A printing model does not need to predict accurate linewidth values. However, a printing model may be calibrated using more data and more advanced models to give an accurate printing linewidth value.

As used herein, a "sub-resolution assist feature (SRAF) printing model" refers to a lithography process model for predicting whether and under which lithographic conditions sub-resolution assist features on the photomask will physically print on the wafer. An SRAF printing model is different from an OPC model in that, in its most basic form, SRAF printing model is only required to predict printing or non-printing of SRAFs in a lithographic mask, while an OPC model is required to predict the shape and size of main features in the lithographic mask with strict accuracy requirements. An SRAF is printed, for example, as a small indentation that starts to appear on the surface of a photoresist layer a consequence of the use of SRAFs, i.e., due to the presence of the SRAFs within the lithographic mask. An SRAF printing model includes both an optical model and a photoresist model, which are herein referred to as an SRAF printing optical model and an SRAF printing photoresist model, respectively. Correspondingly, the pair of optical-photoresist models that constitute an SRAF printing model is different than the pair optical-photoresist models that constitute an OPC model as known in the art.

Full-chip compatible main features models do not usually provide adequate accuracy in predicting SRAF printing, that is, in predicting marginal indentations of the photoresist surface which do not resolve through the photoresist depth and are not included in the calibration of main feature models.

The SRAF printing model of the present disclosure can predict whether and/or under which conditions images of SRAFs exposing the wafer start inducing shallow indentation on the surface of a photoresist layer. In contrast, the OPC model predicts the actual topography shapes of a developed photoresist in the form of physical contours of the photoresist layer topography as seen in a top-down view. As such, the OPC model is calibrated to measurements of photoresist linewidths and/or spacewidths corresponding to the topography of main features, and fails to predict physical printing of the SRAFs accurately until the resist surface indentation caused by the presence of the SRAFs becomes large enough to develop away enough photoresist material and produce a measurable linewidth. Thus, the OPC model does not accurately predict the printing of the SRAFs on the surface of the photoresist layer. Typically, an SRAF printing photoresist model alone does not predict the printing of SRAFs with sufficient accuracy even after proper calibration unless an SRAF printing optical model is also calibrated for the purpose of predicting SRAF printing.

An SRAF printing model can predict the contours of the photoresist topography after a photoresist material in a photoresist layer has been exposed to an image from a scanner and developed with a developer solution. The SRAF printing optical model within the SRAF printing model is used to compute the aerial image intensity distribution that results from the light diffracted by a lithographic mask (which contains resolvable and sub-resolution assist features), and projected onto the photoresist coated wafer by the lithography scanner lens system. The SRAF printing photoresist model within the SRAF printing model uses the aerial image as an input and computes the photoresist topography contours using a polynomial function where the coefficients have been previously calibrated.

An SRAF printing model can be used to predict the linewidths in a photoresist layer of main features. The SRAF printing model differs from the main feature model in that it aims to predict the presence of any small dimpling on the photoresist surface produced by the presence of assist features on the mask. In one embodiment, the accuracy expected from the SRAF printing model is sufficient to predict printing of SRAFs deemed detrimental to the lithography process, while minimizing the occurrences of false flagging, i.e., a prediction for printing that does not actually occur in the photoresist layer.

As used herein, an "SRAF printing constant threshold resist (CTR) model" refers to an SRAF printing photoresist model that uses a simple constant threshold (CTR) to model the chemical reactions of the photoresist.

As used herein, "SRAF printing model calibration" refers to calibration of an SRAF printing model by measuring at least one dimension on a lithographically exposed and developed pattern and adjusting a parameter of the SRAF printing model to minimize the difference between measured and the corresponding modeled dimension.

In one embodiment, the SRAF printing model calibration can differ from a main feature model calibration in that the SRAF printing model calibration employs SEM images, i.e., two-dimensional images, as calibration data in contrast with SEM CD measurements, i.e., scalar values, which are employed in the main feature model calibration. In another embodiment, the SRAF printing model calibration can employ SEM CD measurements of photoresist surface indentations, which is caused by direct printing of SRAFs.

As used herein, an "SRAF printing CTR model" refers to an SRAF printing model in which a simple form of photoresist model polynomial, that is, a single constant threshold term, has been selected for the photoresist model.

As used herein, "calibration" refers to the process of providing a set of at least one new value for one or a the set of parameters and/or coefficients of the lithographic equations comprising a lithography process model such that an output of the lithographic equations minimizes a pre-defined error metric, and/or to the process of verifying a set of at least one pre-existing value for various parameters and/or coefficients of lithographic equations in a lithography process model to confirm that an output of the lithographic equations minimizes a pre-defined error metric. This error metric can include a weighted subtraction between simulated and measured characteristics of a lithographic process. Simulated or measured characteristics of a lithographic process can include, but are not limited to, linewidths in a developed photoresist layer, spaces in a developed photoresist layer, a best focus plane, and an image plane.

As used herein, "SRAF printing model calibration images" refer to images of a lithographically exposed and developed photoresist that is generated for the purpose of providing calibration of an SRAF printing model. In one embodiment, scanning electron microscopy (SEM) images can be employed to calibrate an SRAF printing model. Use of SEM images is not a restriction upon implementation of the methods of the present disclosure, however, and linewidth measurements using SEM can also be used if available. However, an accurate SEM linewidth measurement on small dimpling in the photoresist caused by SRAFs is not known in the art.

As used herein, an element is "marginally present" is the element can disappear with a marginal incremental change or a marginal decremental change in a processing parameter.

As used herein, a "dimpling inception SEM image" or "indentation inception SEM image" or "SRAF printing inception SEM image" refers to an SEM image in which at least one dimpling or indentation is marginally present as a function of a dose or focus conditions due to the presence of SRAFs on the photomask.

As used herein, an "SRAF nominal processing setting" refers to a process condition setting at which the main feature model is at nominal conditions of focus and dose, and an SRAF printing optical model therein employs the SRAF printing model best focus and the SRAF printing model image plane.

As used herein, "printing SRAF severity" or "SRAF printing severity" refers to the degree of manifestation of a printing SRAF.

As used herein, "printing SRAF severity classification" or "SRAF printing severity classification" refers to classification of printing SRAFs according to printing SRAF severity.

Deeper printing SRAFs have greater chances of transferring to an underlying substrate through an etch process that employs a developed photoresist (and including the printing SRAFs) as an etch mask. Printing SRAFs that occur at the lithography process nominal conditions will likely worsen for off-nominal process conditions, increasing the chances of transferring to the silicon substrate through the etch process. Hence, printing severity can be classified according to the chances of transferring to the silicon substrate. It is possible that input from an experienced lithographer may be needed to be able to classify the severity of Printing SRAF. Several discrete groups of SRAF printing severity can be formed for purposes of calibrating one or several SRAF printing photoresist models.

Figure 1B:
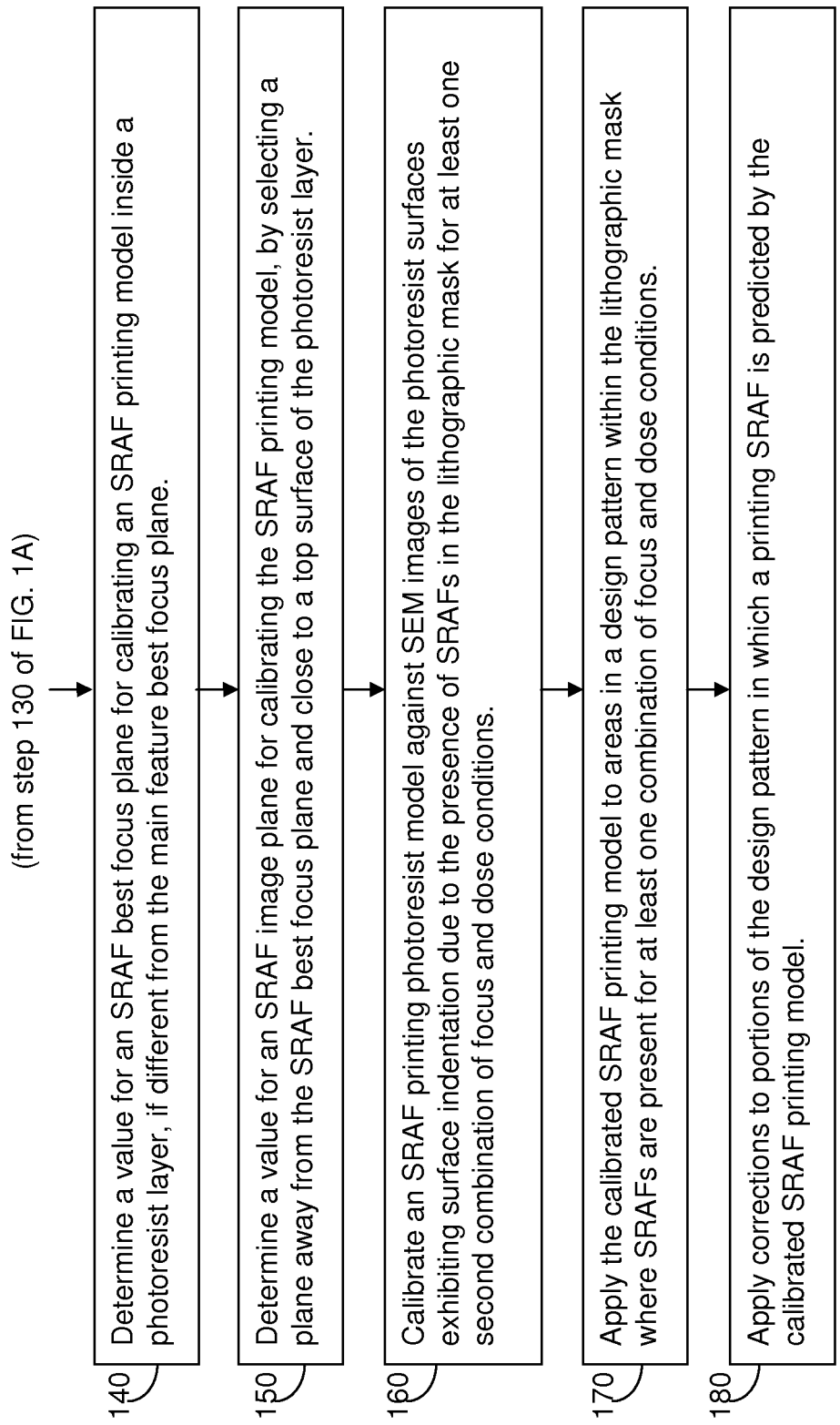
FIG. 1B is a second part of the flow chart illustrating a method for calibrating an SRAF printing model according to an embodiment of the present disclosure.

An SRAF printing model can be calibrated, for example, employing the steps illustrated in the flow chart of FIGS. 1A and 1B. Referring to an optional step 115 of FIG. 1A, a sampling plan for a data collection plan can be generated. The sampling plan for data collection can include a subset of design data that is present within the lithographic mask and includes main features and SRAFs. The selected subset of design data is also referred to a "set of calibration patterns" or a "calibration sampling plan."

Referring to step 120 of FIG. 1A, images of a patterned photoresist layer on a substrate are generated. The patterned photoresist layer has a photoresist top surface that exhibits surface indentation due to presence of SRAFs in a lithographic mask for at least one combination of focus and dose conditions. The at least one combination of focus and dose conditions employed to form the patterned photoresist layer is herein referred to as at least one first combination of focus and dose conditions. The at least one first combination of focus and dose conditions can be a plurality of focus and dose conditions.

For example, at least one substrate, or at least one "wafer," is coated with a photoresist layer, and is subsequently lithographically exposed in a lithography scanner. The shapes on the lithographic mask are illuminated and imaged through a lens system of a scanner onto the photoresist layer at the wafer plane.

Figure 2:
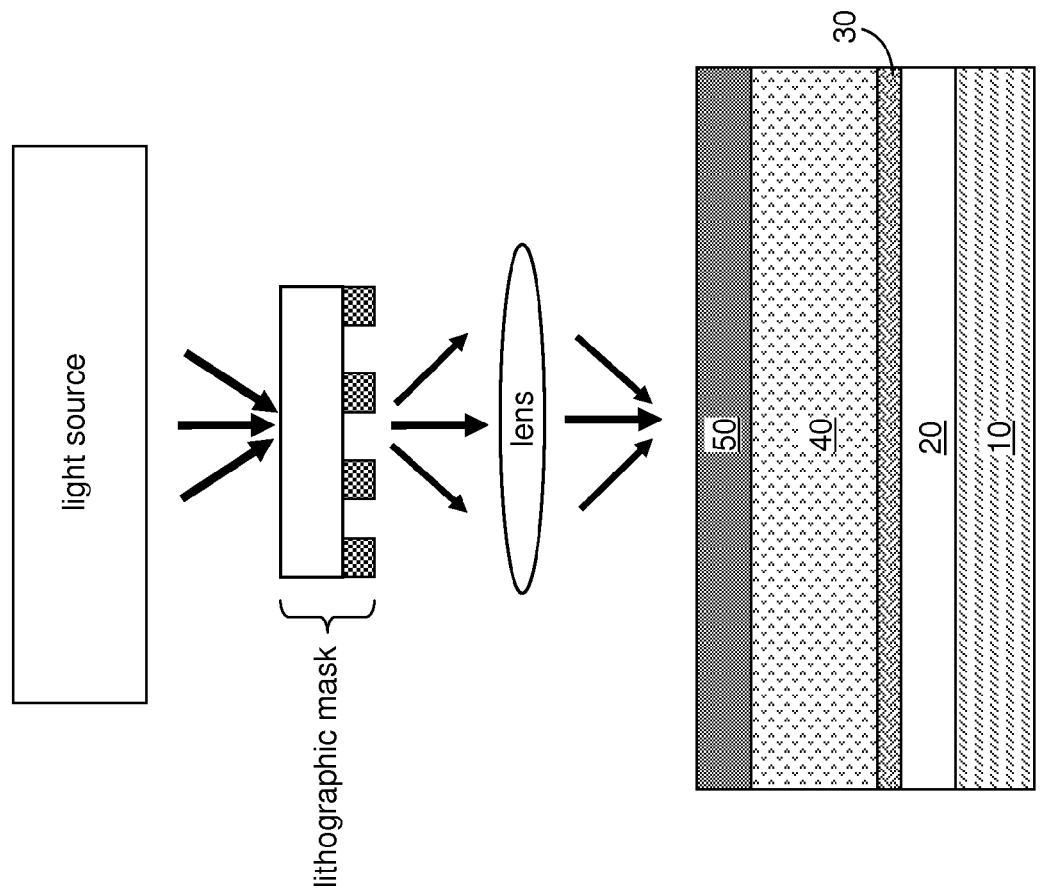
FIG. 2 is a schematic diagram illustrating an optics system and a lithographic material stack.

FIG. 2 illustrates an optics system and a lithographic material stack. The lithographic material stack includes, from bottom to top, a substrate 10, an underlayer 20 that is subsequently deposited on the substrate 10 and including at least one of a semiconductor material, a conductive material, and an insulator material, a bottom antireflective coating (BARC) layer 30, a photoresist layer 40, and a top antireflective coating (TARC) layer 50. The lithographic mask includes physical shapes corresponding to the design to be transferred to the photoresist layer 40 on the substrate 10, which can be a wafer as known in the art.

Figure 3:
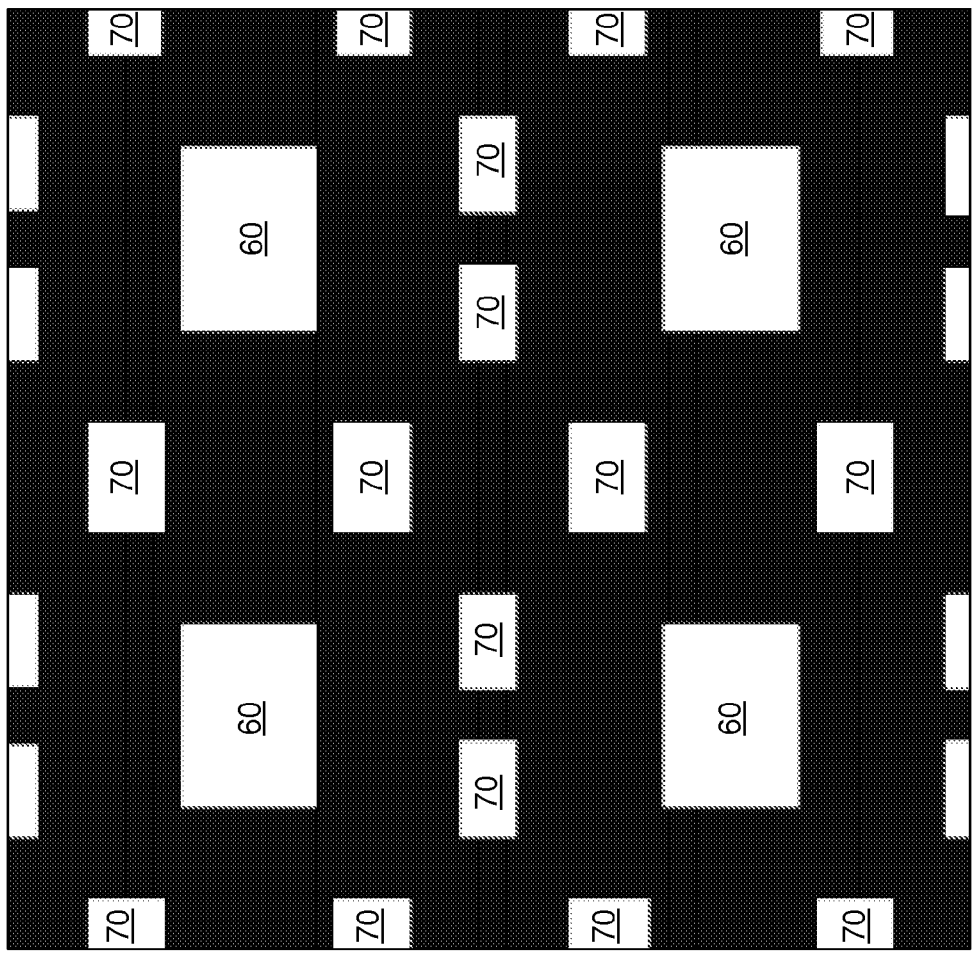
FIG. 3 is a top-down view of an exemplary lithographic mask including main features and SRAFs.

Referring to FIG. 3, an exemplary lithographic mask includes main features 60 and SRAFs 70. In an ideal case, the shapes of the main features 60 are intended to be physically manifested in a developed photoresist, and the shapes of the SRAFs 70 are intended not to be physically manifested in the developed photoresist. However, the shapes of the SRAFs 70 can be manifested outside a narrow processing window for a combination of focus and dose conditions, or even at an optimal setting for the combination of focus and dose conditions if the shapes of the SRAFs 70 are not optimized.

A lithographically exposed photoresist layer 40 is subsequently developed. Depending on the polarity of the material of the photoresist layer 40, lithographically exposed portions or unexposed portions of the photoresist layer 40 are removed during the development step, thereby generating a developed photoresist layer with topography. The developed photoresist layer 40 is the patterned photoresist layer, from which images of the patterned photoresist layer can be subsequently generated.

The images of the patterned photoresist layer can be generated, for example, employing a scanning electron microscopy (SEM) apparatus. Gathering data from the patterned photoresist layer is herein referred to as performing metrology on the patterned photoresist layer. Specifically, SEM line- or space-width metrology is performed on printed main feature images, i.e., images of resolved main features on the lithographic mask. As SEM images of various mask patterns including different sizes of SRAFs are gathered, some printing SRAFs are visible within a subset of the SEM images derived from mask patterns including a sufficiently large set of SRAFs sizes. The SEM images can be taken at nominal dose and focus conditions and at conditions other than the nominal dose and focus conditions.

In one embodiment, linewidths and/or spacewidths of selected patterns for a calibration set can be measured in the developed photoresist layer 40. The measurements of the linewidths and/or spacewidths can be performed using metrology tools such as scanning electron microscopes (SEMs).

Optionally, measurement data can be screened to remove outliers in order to enhance accuracy of measured data. A large set of measured linewidth values and/or spacewidth values (which is referred to as critical dimension values or CD values) can be obtained for selected calibration patterns. This type of measurements can be repeated at various focus and dose conditions.

Referring to an optional step 122, the images of the patterned photoresist layer 40 can be classified according to severity of the surface indentation due to SRAFs into at least two categories, i.e., into a plurality of categories.

In one embodiment, printing severity can be classified according to the chances of transfer of the surface indentations into an underlying substrate during an etch process, which can be performed after the lithographic exposure and development of the photoresist layer 40. For example, a higher score can represent higher probability of a pattern of a printing SRAF to be transferred into the underlying substrate during the etch. SEM images for nominal and non-nominal focus and dose conditions can be classified according to the chances of transfer of surface indentations of printing SRAFs.

In one embodiment, during SEM image classification according to printing severity, cases at nominal conditions can be considered and weighted with a more severe classification than those at off-nominal conditions, i.e., printing SRAFs present at nominal focus and dose conditions can be given an additional positive score to reflect greater undesirability of presence of printing SRAFs at the nominal conditions relative to presence of printing SRAFs at non-nominal conditions.

After the optional step 122, a main feature optical model optimization can be optionally performed, which includes the step of optimizing the values of best focus plane and the image plane used for simulation on main feature. Optionally, values of apodization of the lens and/or image diffusion can also be optimized.

Referring to an optional step 135, a main feature model can be calibrated employing a main feature best focus plane and a main feature image plane. Contours of the patterned photoresist layer are simulated at the main feature image plane for main features within the lithographic mask.

In this context, the main feature best focus plane is a substantially horizontal plane within the thickness of the photoresist layer 40 in the direction perpendicular to the wafer surface at which the image is focused. The main feature image plane is another substantially horizontal plane at a height within the thickness of the photoresist layer 40 at which the simulated resist contours and resist line-width or space-width is determined. The height of the main feature best focus plane and the height of the main feature image plane can be measured, for example, downward from the interface between the photoresist layer 40 and the TARC layer 50 in the structure of FIG. 2. The reference wafer plane used in a simulation does not necessarily align, in an absolute scale, with the reference plane used at the wafer. Thus, the values for main feature best focus plane and the main feature image plane, i.e., the height of the main feature best focus plane and the height of the main feature image plane, to use in the simulation may need to be calculated.

Optimum values for the main feature best focus plane and the main feature image plane for calibrating the main feature model can be determined to predict the contours of printed main feature images in the photoresist.

A non-limiting example of a sequence of steps that can be employed for the main feature optical model optimization includes the following steps. In a first step of the sequence for main feature optical model optimization, an initial pair of values for the best focus plane and the image-plane is selected for the main feature optical model. The main feature optical model at this setting is then used to calculate the aerial image corresponding to each pattern in the calibration set. A simple constant threshold resist model can be applied, as a main feature photoresist model, to this aerial image to extract the simulated critical dimension (CD) value along the same direction as was measured in the SEM. This CD value is computed for all calibration patterns.

In a second step of the sequence for main feature optical model optimization, for each pair of values for the best focus plane and the image plane under evaluation, the corresponding critical dimension is obtained by simulation, which is herein referred to as a simulated CD value. The simulated CD value is determined for all calibration patterns. The difference between the measured values for the CD and the simulated CD values is computed for each calibration pattern. A root mean square (RMS) value for the difference is determined by squaring each difference between a measured value and the corresponding simulated value for the CD of each calibration pattern, averaging the squared differences, and then calculating the square root of the average. This RMS value is herein referred to as a single root mean squared (RMS) error value, which can be displayed, for example, in units of nanometers. In one embodiment, each RMS value can constitute one point in a three-dimensional plot of RMS error values defined over a two-dimensional definition range including the best focus plane and the image plane as two-dimensional parameters.

In a third step of the sequence for main feature optical model optimization, the second step of the sequence for main feature optical model optimization is repeated for a range of combinations for the pair a best focus plane variable and an image plane variable.

In one embodiment, the third step of the sequence for main feature optical model optimization can be employed to generate a two-dimensional contour plot of equi-root-mean-square (equi-RMS) error lines as measured in the space of the focus plane and the image plane for one or more focus and exposure conditions. Such a two-dimensional contour plot can show at least one optimum pair of values for a main feature best focus plane and a main feature image plane. At the optimum pair or pairs of values for the main feature best focus plane and the main feature image plane, the overall RMS error between simulated CD values and measured CD values is minimized. More than one optimum pair is considered when the overall error RMS of two such pairs is less than say 0.2 nm.

The two-dimensional contour plot can be generated by employing a computational lithography program. Depending on the type of SEM images employed to generate measured CD values and corresponding simulated CD values, different types of two-dimensional contour plots can be generated.

Figure 4:
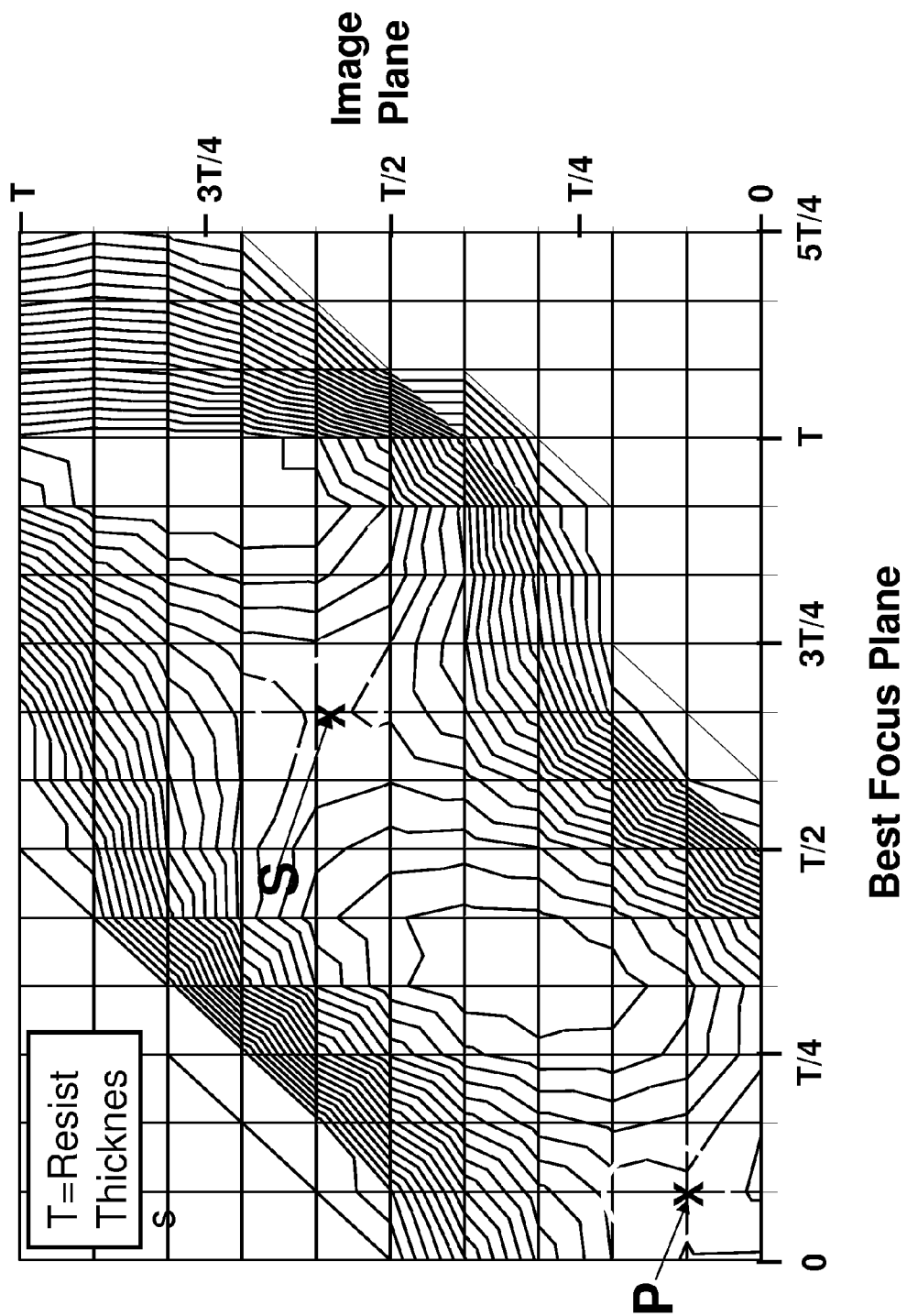
FIG. 4 is an exemplary first type two-dimensional contour plot of equi-root-mean-square (equi-RMS) error lines as measured in the space of the focus plane and the image plane for a nominal focus and exposure conditions.

Referring to FIG. 4, an exemplary first type two-dimensional contour plot of equi-root-mean-square (equi-RMS) error lines as measured in the space of the focus plane and the image plane for the case of data collected at nominal focus and exposure conditions is shown. To generate a first type two-dimensional contour plot, a large enough set of photoresist CD measurement values is collected for calibration at a single combination of focus and dose conditions, i.e., at a fixed value of focus and at a fixed value of dose during lithographic exposure of a photoresist layer. The corresponding set of the simulated photoresist CD values can be computed for each calibration pattern using a lithography simulator such as Calibre by Mentor Graphics®.

Next, a simple constant threshold resist (CTR) model can be selected as a photoresist model. The CTR model suffices for the purpose of generating the first type two-dimensional contour plot because the purpose of generating the first type two-dimensional contour plot is to optimize the optical parameters of main feature best focus plane and the main feature image plane that best represents the aerial image.

Subsequently, a pair of values for a main feature best focus plane (which is an optical parameter) and a main feature image plane (which is another optical parameter) is selected. A simulated CD value at the CTR threshold, i.e., the threshold of the CTR model, is calculated for all calibration patterns with a main feature model that employs the CTR model as a main feature photoresist model. The difference between each pair of a measured CD value and a corresponding simulated CD value is calculated for all calibration patterns. A value for a root-mean-square error (RMS error) is extracted, and then assigned to the corresponding pair of values for the main feature best focus plane and the main feature image plane under evaluation. This value for the RMS error represents one point in the two-dimensional definition range of the main feature best focus plane in FIG. 4 and the main feature image plane in FIG. 4.

Subsequently, different pairs of values for the main feature best focus plane and the main feature image plane are selected, and calculation of the RMS error between measured CD values and the corresponding simulated CD values is performed for each pair of values for the main feature best focus plane and the main feature image plane. In one embodiment, the CTR threshold can be changed in each iteration as the pair of values for the main feature best focus plane and the main feature image plane is changed, either by setting the threshold to the value that makes the anchor feature print on target, or by using the threshold that minimizes the error RMS value for that set of best-focus-plane/image-plane.

The selection of different pairs of values for the main feature best focus plane and the main feature image plane and subsequent calculation of a corresponding RMS error is repeated for a range of values for the main feature best focus plane and for a range of values for the main feature image plane within approximately the thickness of the photoresist layer 40. A first type two-dimensional contour plot of equi-root-mean-square (equi-RMS) error lines as illustrated in FIG. 4 can be thus generated. In FIG. 4, T represents the thickness of the photoresist, the x-axis represents the location of the best focus plane as measured downward from the topmost surface of the photoresist, and the y-axis represents the vertical distance of the image plane as measured downward from the topmost surface of the photoresist. As such, the topmost surface of the photoresist corresponds to the value of 0 for the best focus plane and the image plane, and the bottommost surface of the photoresist corresponds to the value of T for the best focus plane and the image plane.

The first type two-dimensional contour plot of equi-root-mean-square (equi-RMS) error lines is generated employing a set of measurements collected only at a single set of process conditions, i.e., a single combination of focus and dose during lithographic exposure. In one embodiment, the single set of process conditions can be the nominal conditions, that is, conditions of a best focus and best dose at the wafer as estimated or known at the time of generation of the SEM images.

The first type two-dimensional contour plot of equi-root-mean-square (equi-RMS) error lines displays minima along definition ranges having a general shape of a saddle chair, such as an X-shaped region around the point labeled "P" and another X-shaped region around the point labeled "S" in FIG. 4. Within each X-shaped region, a local optimum pair of a main feature best focus plane value and a main feature image plane value is provided such as the point "P" and the point "S." The reason for the existence of the saddle shapes around each minimum point in the first type two-dimensional contour plot of equi-root-mean-square (equi-RMS) error lines is due to a finite bandwidth of a laser employed to lithographically expose the photoresist layer.

The variable best focus plane in FIG. 4 increases with distance of the main feature focus plane from the topmost surface of the TARC layer 50, with a minimum value for focus plane corresponding to the interface between the TARC layer 50 and the photoresist layer 40. Likewise, the variable image plane in FIG. 4 increases with distance of the main feature image plane from the topmost surface of the TARC layer 50, with a minimum value for image plane corresponding to the interface between the TARC layer 50 and the photoresist layer 40. The point at which the RMS error achieves a global minimum is indicated by the point "P."

In general, the value for the main feature best focus plane and the value for the main feature image plane are determined by selecting a point in a two-dimensional definition range of a best focus plane and an image plane. The selected point is one of a set of equivalent optimum minimum points for a root-mean-square error (RMS error) function that calculates root-mean square differences between measured widths for lines or spaces generated from SEM images under a single combination of focus and dose conditions and corresponding simulated widths for lines or spaces. At least one minimum is achieved when both the main feature best focus plane and the main feature image plane are both close to the topmost surface of the photoresist layer 40. The main feature best focus plane and the main feature image plane corresponding to one minimum point are at, or in the vicinity of, the topmost surface of the photoresist layer 40. In one embodiment, the main feature best focus plane and the main feature image plane can be within 10% of the thickness of the photoresist layer 40 from the topmost surface of the photoresist layer 40, and located either within the photoresist layer 40 or within the TARC layer 50. Thus, the main feature image plane is more proximal to the topmost portion of the photoresist top surface than a photoresist bottom surface.

Figure 5:
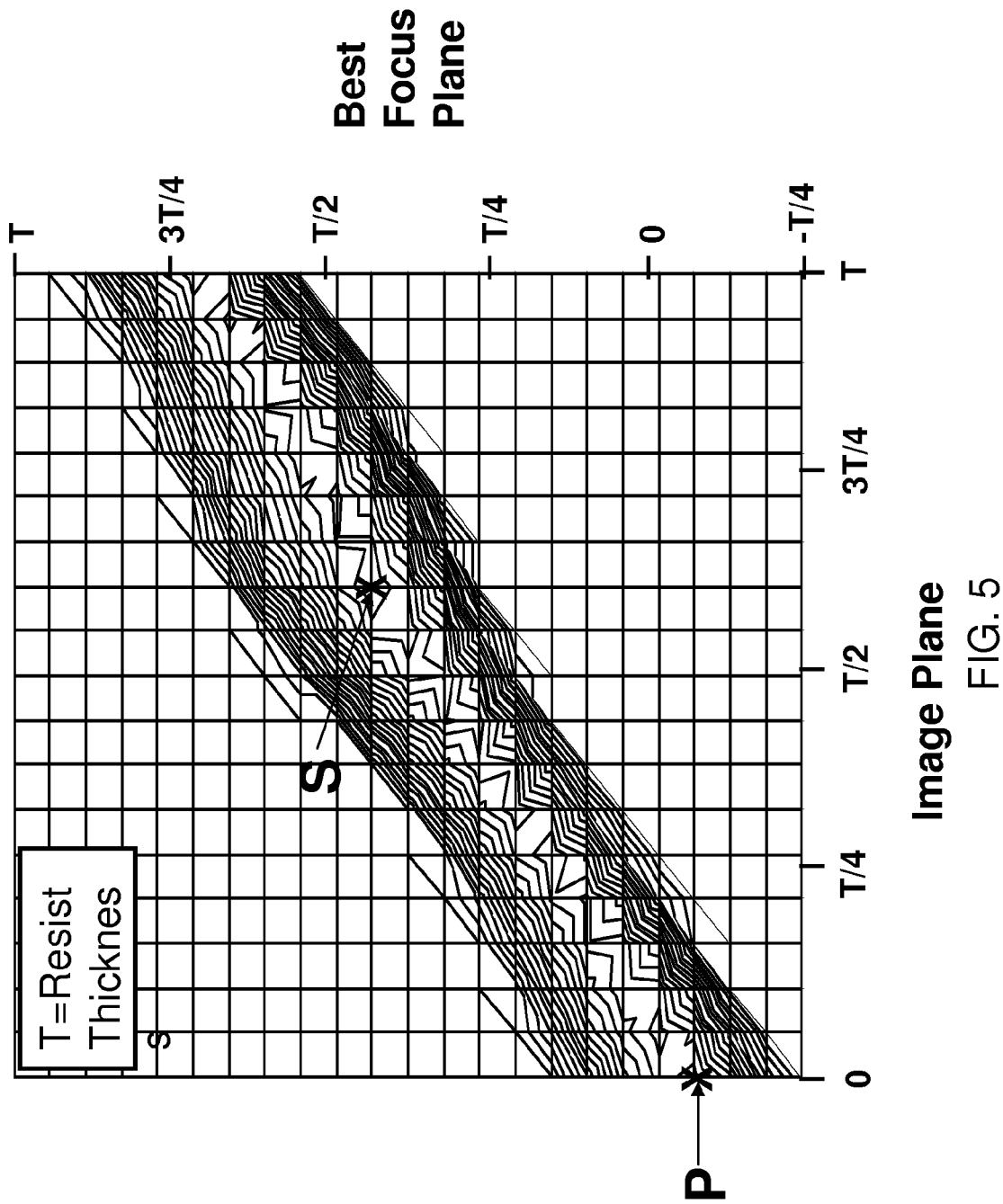
FIG. 5 is an exemplary second type two-dimensional contour plot of equi-root-mean-square (equi-RMS) error lines as measured in the space of the focus plane and the image plane for a nominal focus and exposure conditions.

Referring to FIG. 5, an exemplary second type two-dimensional contour plot of equi-root-mean-square (equi-RMS) error lines as measured in the space of the focus plane and the image plane for a nominal focus and exposure conditions is shown. To generate a second type two-dimensional contour plot, a large enough set of photoresist CD measurement values is collected for calibration at multiple combinations of focus and dose conditions, i.e., multiple pairs of values for the focus and dose are employed during the lithographic exposure and measurement of a photoresist layer. The corresponding set of the simulated photoresist CD values can be computed for each calibration pattern using a lithography simulator such as Calibre by Mentor Graphics®.

Thus, the set of measurement data is generated at more than one process conditions. For example, measurement data can be collected at the nominal focus and nominal dose conditions, and then additional measurement data can be collected at a finite defocus from the nominal focus and/or at a finite dose deviation from the nominal dose. Simulations with a main feature optical model can be performed using the value of the main feature best focus under evaluation to compute the simulated CD values for all calibration patterns. The CD difference between the simulation CD value and the measurement CD value can be calculated with respect to the measurements at the nominal focus. In addition, simulations with the main feature optical model can be performed using the value of the finite defocus from the nominal focus and/or finite dose deviation to compute the simulated CD values for all calibration patterns at the finite defocus and/or at a finite dose deviation. The difference between the simulated CD values and the measured CD values is computed with respect to the data collected at the finite defocus and/or at a finite dose deviation. For non-limiting illustrative purposes, the amount of defocus can be, for example, +/−10 nm, +/−20 nm, +/−30 nm, etc. For non-limiting illustrative purposes, the amount of dose deviation can be, for example, +/−5%, +/−10%, +/−15%, etc.

Subsequently, a single value for an RMS error between the measured CD values and the corresponding simulated CD values is computed by calculating a non-weighted or weighted average of squares of the differences of measured CD values and the corresponding simulated CD values, and subsequently calculating a square root value thereof.

The second type two-dimensional contour plot of equi-root-mean-square (equi-RMS) error lines displays local minima long a diagonal line within the two-dimensional plane of a main feature best focus plane and a main feature image plane as illustrated in FIG. 5. For example, the local minima corresponds to a point labeled "P" and another point labeled "S" in FIG. 5. Each local minimum in FIG. 5 corresponds to a local optimum pair of a main feature best focus plane value and a main feature image plane value in close proximity to each other. In FIG. 5, T represents the thickness of the photoresist, the y-axis represents the location of the best focus plane as measured downward from the topmost surface of the photoresist, and the x-axis represents the vertical distance of the image plane as measured downward from the topmost surface of the photoresist. As such, the topmost surface of the photoresist corresponds to the value of 0 for the best focus plane and the image plane, and the bottommost surface of the photoresist corresponds to the value of T for the best focus plane and the image plane.

The variable best focus plane in FIG. 5 increases with distance of the main feature best focus plane from the topmost surface of the TARC layer 50, with a minimum value for best focus plane corresponding to a substantially horizontal plane in the TARC layer 50 and the photoresist layer 40. Likewise, the variable image plane in FIG. 5 increases with distance of the main feature image plane from the topmost surface of the TARC layer 50, with a minimum value for image plane corresponding to the interface between the TARC layer 50 and the photoresist layer 40. At least one minimum is achieved when both the main feature best focus plane and the main feature image plane are close to the topmost surface of the photoresist layer 40. The point at which the RMS error achieves a global minimum is indicated by the point labeled "P."

In general, the value for the main feature best focus plane and the value for the main feature image plane are determined by selecting a point in a two-dimensional definition range of a best focus plane and an image plane. The selected point is one of a set of equivalent optimum minimum point for a root-mean-square error (RMS error) function that calculates root-mean square differences between measured widths for lines or spaces generated from SEM images under multiple combinations of focus and dose conditions and corresponding simulated widths for lines or spaces. The main feature best focus plane and the main feature image plane corresponding to one minimum point are at or in the vicinity of the topmost surface of the photoresist layer 40. In one embodiment, the main feature best focus plane and the main feature image plane can be within 10% of the thickness of the photoresist layer 40 from the topmost surface of the photoresist layer 40, and located either within the photoresist layer 40 or within the TARC layer 50. Thus, the main feature image plane is more proximal to the topmost portion of the photoresist top surface than a photoresist bottom surface.

Referring to an optional step 137 of FIG. 1A, a main feature model can be calibrated employing the main feature best focus plane and the main feature image plane as determined at the optional step 135. For example, the value of the main feature best focus plane and the value of the main feature image plane can be values corresponding to the point "P" in FIG. 4 or the point "P" in FIG. 5. Images of main features within the lithographic mask are at maximum sharpness at the main best focus plane.

The main feature model includes a main feature optical model and a main feature photoresist model. The main feature optical model within the main feature model can be calibrated with measurements on the images of the patterned photoresist layer. For example, the main feature optical model is calibrated by determining a value for a main feature best focus plane and a value for a main feature image plane using measurements on printed main feature images among the images of the patterned photoresist layer. In one embodiment, the measurements on the printed main feature images can include at least one of a linewidth measurement and a spacing measurement.

In one embodiment, the main feature optical model can be optimized employing the parameters determined at the optional step 135, i.e., employing the value for the main feature best focus plane and the value for the main feature image plane, which can correspond to the point "P" in the contour plot of FIG. 4 or in the contour plot of FIG. 5.

The main feature photoresist model within the main feature model can also be calibrated. In one embodiment, the main feature photoresist model can be more complex than a simple constant threshold resist (CTR) model. In this case, the main feature photoresist model can include a polynomial with various terms, each containing a coefficient multiplying a basis function that describes some physical phenomena of photoresist chemistry and the development process. The number or terms and the basis functions used can be defined by the modeler. Alternately, the number of terms and the basis functions can be provided by a software provider, and a modeler can select which basis functions to use in the main feature photoresist model. In one embodiment, the basis functions also contain parameters to be calibrated, while some other parameters can be fixed basis functions.

The polynomial is selected such that, when applied to aerial image intensity, the polynomial produces the photoresist contours that would appear in a photoresist layer if that aerial image intensity lithographically exposed the surface of the photoresist layer. The polynomial is applied to the aerial image corresponding to the calibration patterns. A CD value at the same location as measured in the wafer can be determined from the computed photoresist contours. The difference between simulated and measured CD can be computed. When repeated for all calibration patterns, an overall error RMS values can be determined employing the same method as described above.

The calibration algorithm is an iterative optimization algorithm, which can determine which values of the coefficients of the polynomial and other varying parameters of the basis functions provide the smallest difference between measured and simulated CD values in terms of the error RMS value for the entire set of calibration patterns. Thus, the calibration algorithm functions as an optimization algorithm, and the optimization is effected by the calibration step. The optimization/calibration algorithm can be computationally intensive. In some embodiments, the optimization/calibration algorithm can run for several thousand iterations.

The main feature photoresist model can be expressed as the polynomial using the optimized coefficients and parameters. The main feature photoresist model can be embodied as a text file that includes the optimized coefficients and parameters.

In one embodiment, the main feature photoresist model employed at step 137 can be subsequently utilized as an SRAF printing photoresist model within an SRAF printing model at a subsequent step 160 (See FIG. 1B).

After the optional step 137, an SRAF printing model is calibrated against the images by determining a value for an SRAF printing best focus plane and by determining a value for an SRAF printing image plane and an SRAF printing resist model employing a sequence of processing steps, which can be, for example, a sequence of step 140, step 150, and step 160. In one embodiment, the order of steps 140 and 150 can be reversed.

Referring to step 140, a value for an SRAF printing best focus plane for calibrating an SRAF printing model is determined. The SRAF printing best focus plane is selected from among horizontal planes inside a photoresist layer. The SRAF printing best focus plane can be selected to be the same as the main feature best focus plane. Alternatively, the SRAF printing best focus plane can be selected independent of the main feature best focus plane if different from the main feature best focus plane.

Referring to step 150, a value for an SRAF printing image plane for calibrating the SRAF printing model is determined by selecting a plane away from the SRAF printing best focus plane and close to a top surface of the photoresist layer.

Referring to step 160, an SRAF printing resist model is calibrated against SEM images of the photoresist surfaces exhibiting surface indentation due to the presence of SRAFs in the lithographic mask for at least one combination of focus and dose conditions, which is herein referred to as at least one second combination of focus and dose conditions.

The combination of steps 140, 150, and 160 can be performed in many different embodiments. In a first embodiment, the SRAF printing model can be calibrated by first setting an SRAF printing best focus plane inside a photoresist layer, and by setting an SRAF printing image plane at the top of, or near the top of, the photoresist layer. In one embodiment, the SRAF printing best focus plane can be the same as the point "S" in FIG. 4 or in FIG. 5. In another embodiment, the SRAF printing image plane can be the same as the plane including the point "P" in FIG. 4 or FIG. 5.

Subsequently, once the optical parameters of the SRAF printing best focus plane and the SRAF printing image plane are fixed, an SRAF printing photoresist model can be calibrated against the SEM images so that the SRAF printing photoresist model predicts correctly as many cases of presence or absence of printing SRAFs, as observed in the SEM images generated at step 120, as possible.

In a second embodiment, the SRAF printing model can be calibrated by first setting an SRAF printing best focus plane inside a photoresist layer, and by setting an SRAF printing image plane at the top of, or near the top of, the photoresist layer. In one embodiment, the SRAF printing best focus plane can be the same as the main feature best focus plane of the point "S" in FIG. 4 or in FIG. 5. In another embodiment, the SRAF printing image plane can be the same as the plane including the point "P" in FIG. 4 or FIG. 5.

Subsequently, once the optical parameters of the SRAF printing best focus plane and the SRAF printing image plane are fixed, a constant threshold resist (CTR) model can be employed for an SRAF printing photoresist model within the SRAF printing model. The CTR model is calibrated against the SEM images so that the calibrated CTR model predicts correctly as many cases of presence or absence of printing SRAFs, as observed in the SEM images generated at step 120, as possible.

Specifically, during the calibration of the SRAF printing model, a single SRAF printing image plane can be employed to evaluate the printing or non-printing of SRAFs. If the CTR model is employed for the SRAF printing photoresist model, the threshold at which SRAFs begin to print is determined based on the images generated at step 120. The determination of the threshold can be performed employing all calibration patterns and all process conditions, including any variations of focus and/or dose employed to generate the SEM images at step 120.

If a range of threshold values is obtained corresponding to the various SRAF configurations on the photomask and/or to the various combinations of dose and focus conditions that are present within the set of SEM images generated at step 120, the various threshold values can be classified in terms of printing severity as applied at step 122, or as classified at step 160 if step 122 is not previously performed. For example, in a dark field lithographic mask, a higher threshold value can have a higher severity factor.

The threshold value for the CTR model can be selected such that the selected threshold value produces a calibrated SRAF printing model that predicts presence of a printing SRAF whenever a corresponding SEM images show a printing SRAF, and absence of a printing SRAF whenever a corresponding SEM images show absence of a printing SRAF with sufficient accuracy. In one embodiment, the accuracy of the prediction can be greater than 80%, i.e., the prediction matches the SEM image at a frequency of 80% or greater. In another embodiment, the accuracy of the prediction can be greater than 90%. In yet another embodiment, the accuracy of the prediction can be greater than 95%. In still another embodiment, the accuracy of the prediction can be greater than 99%.

In the second embodiment, a complex photoresist model can be employed as the SRAF printing photoresist model instead of a CTR model. The complex photoresist model can be calibrated against measured dimensions, such as linewidths and/or space widths, of printed main features in the SEM images generated at step 120. In this case, a critical dose at which SRAFs begin to print is determined based on the images generated at step 120. The determination of the critical dose can be performed employing all calibration patterns and all process conditions, including any variations of focus and/or dose employed to generate the SEM images at step 120.

If a range of critical dose values is obtained corresponding to the various SRAF configurations on the photomask and/or to the various combinations of dose and focus conditions that are present within the set of SEM images generated at step 120, the various critical dose values can be classified in terms of printing severity as applied at step 122, or as classified at step 160 if step 122 is not previously performed. For example, in a dark field lithographic mask, a lower critical dose can have a higher severity factor.

The critical dose value for the complex photoresist model can be selected such that the selected critical dose value produces a calibrated SRAF printing model that predicts presence of a printing SRAF whenever a corresponding SEM images show a printing SRAF, and absence of a printing SRAF whenever a corresponding SEM images show absence of a printing SRAF with sufficient accuracy. In one embodiment, the accuracy of the prediction can be greater than 80%, i.e., the prediction matches the SEM image at a frequency of 80% or greater. In another embodiment, the accuracy of the prediction can be greater than 90%. In yet another embodiment, the accuracy of the prediction can be greater than 95%. In still another embodiment, the accuracy of the prediction can be greater than 99%.

In a third embodiment, the SRAF printing model can be calibrated by first setting an SRAF printing best focus plane inside a photoresist layer, and by setting an SRAF printing image plane at the top of, or near the top of, the photoresist layer. In one embodiment, the SRAF printing best focus plane can be the same as the main feature best focus plane of the point "S" in FIG. 4 or in FIG. 5. In another embodiment, the SRAF printing image plane can be the same as the plane including the point "P" in FIG. 4 or FIG. 5.

Subsequently, once the optical parameters of the SRAF printing best focus plane and the SRAF printing image plane are fixed, a complex photoresist model can be employed for an SRAF printing photoresist model within the SRAF printing model. In one embodiment, the complex photoresist model can be the same as the main feature photoresist model calibrated at step 137.

In a fourth embodiment, the SRAF printing model can be calibrated by first setting an SRAF printing best focus plane inside a photoresist layer. In one embodiment, the SRAF printing best focus plane can be the same as the main feature best focus plane of the point "S" in FIG. 4 or in FIG. 5.

Subsequently, once the optical parameters of the SRAF printing best focus plane is fixed, the main feature photoresist model employed at step 137 can be employed for the SRAF printing photoresist model.

Thereafter, the SRAF printing model image plane can be calibrated. Specifically, an image plane at which an SRAF printing starts to occur, i.e., is marginally present, is selected as the SRAF printing model image plane. In other words, the SRAF printing image plane can be calibrated employing dimpling inception SEM images.

In this case, a complex photoresist model can be employed as the SRAF printing photoresist model, and is calibrated against the SEM images collected at step 120 so that the SRAF printing photoresist model predicts correctly as many cases of presence or absence of SRAF printings. Specifically, the critical SRAF printing model image plane for the SRAF printing model employing a complex photoresist model can be selected such that the selected SRAF printing model image plane produces a calibrated SRAF printing model that predicts presence of a printing SRAF whenever a corresponding SEM images show a printing SRAF, and absence of a printing SRAF whenever a corresponding SEM images show absence of a printing SRAF with sufficient accuracy. In one embodiment, the accuracy of the prediction can be greater than 80%, i.e., the prediction matches the SEM image at a frequency of 80% or greater. In another embodiment, the accuracy of the prediction can be greater than 90%. In yet another embodiment, the accuracy of the prediction can be greater than 95%. In still another embodiment, the accuracy of the prediction can be greater than 99%.

An SRAF printing model calibrated employing one of the methods of the present disclosure can predict presence or absence of an SRAF printing with greater accuracy compared to lithographic models employing a best focus plane and an image plane that are located in close proximity to each other and/or at, or near, the top surface of a photoresist layer. This is because in dark field masks, SRAF intensity tends to peak at a focal plane different from the plane where the main feature intensity is a maximum.

In general, the interaction between the aerial image impinging on the wafer surface and the photoresist film stack changes the interference of the focusing image. Thus, the final latent image intensity distribution inside the photosensitive photoresist layer determines the pattern to be formed in a developed photoresist layer. The final latent image intensity distribution depends on where the aerial image plane is focused relative to the height inside the photoresist layer. The film stack has some effect on the latent image intensity. Even with the effect of the resist film stack on the image intensity distribution, the intensity of the SRAFs in image in resist for dark field masks tends to be at maximum at a focal plane different than the plane of best focus plane of the main feature.

Figure 6A:
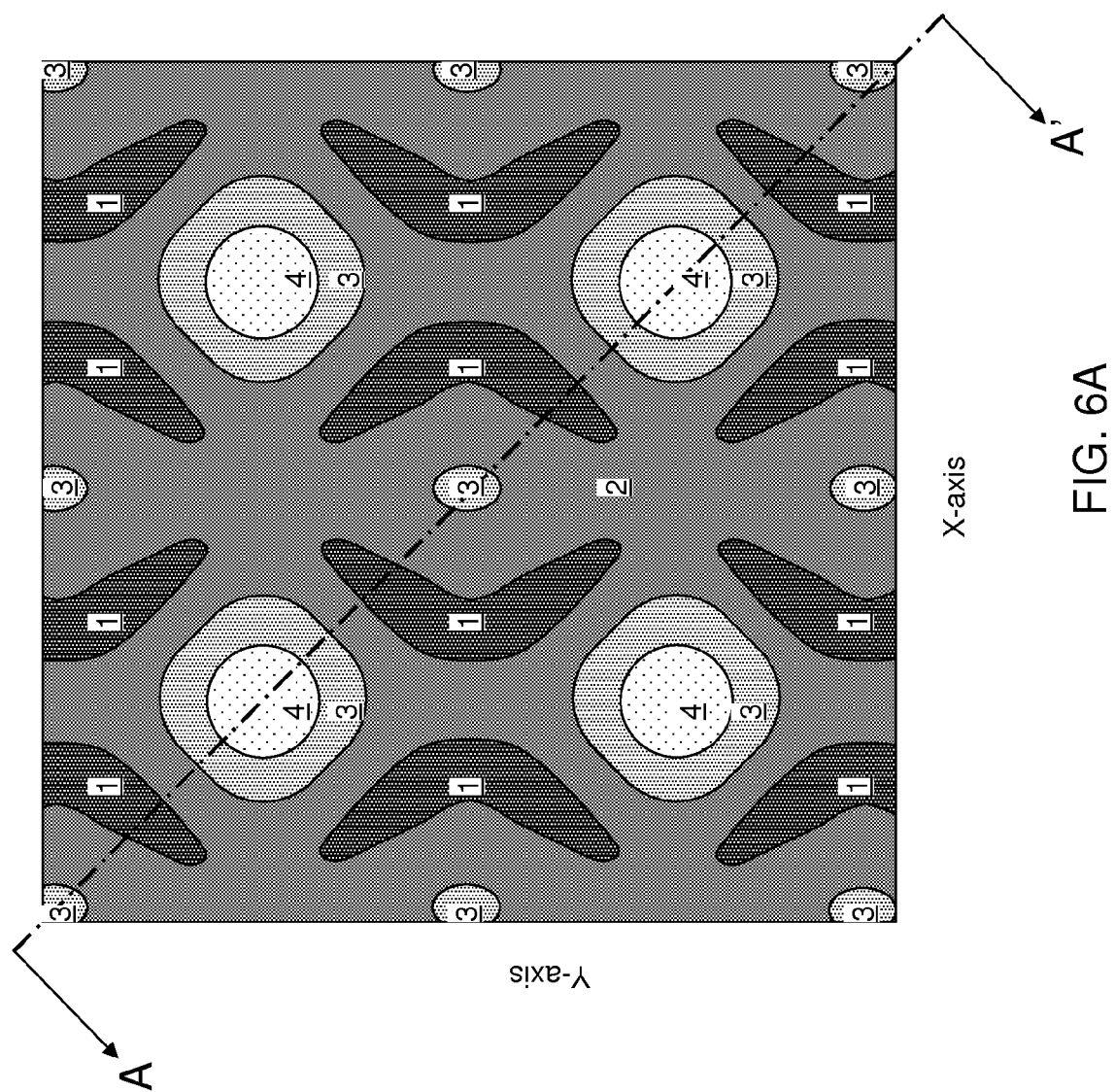
FIG. 6A is an equi-exposure contour plot of the intensity of illumination within a horizontal plane Z1-Z1' of FIG. 6B of a photoresist that is illuminated with light employing the lithographic mask of FIG. 3.
Figure 6B:
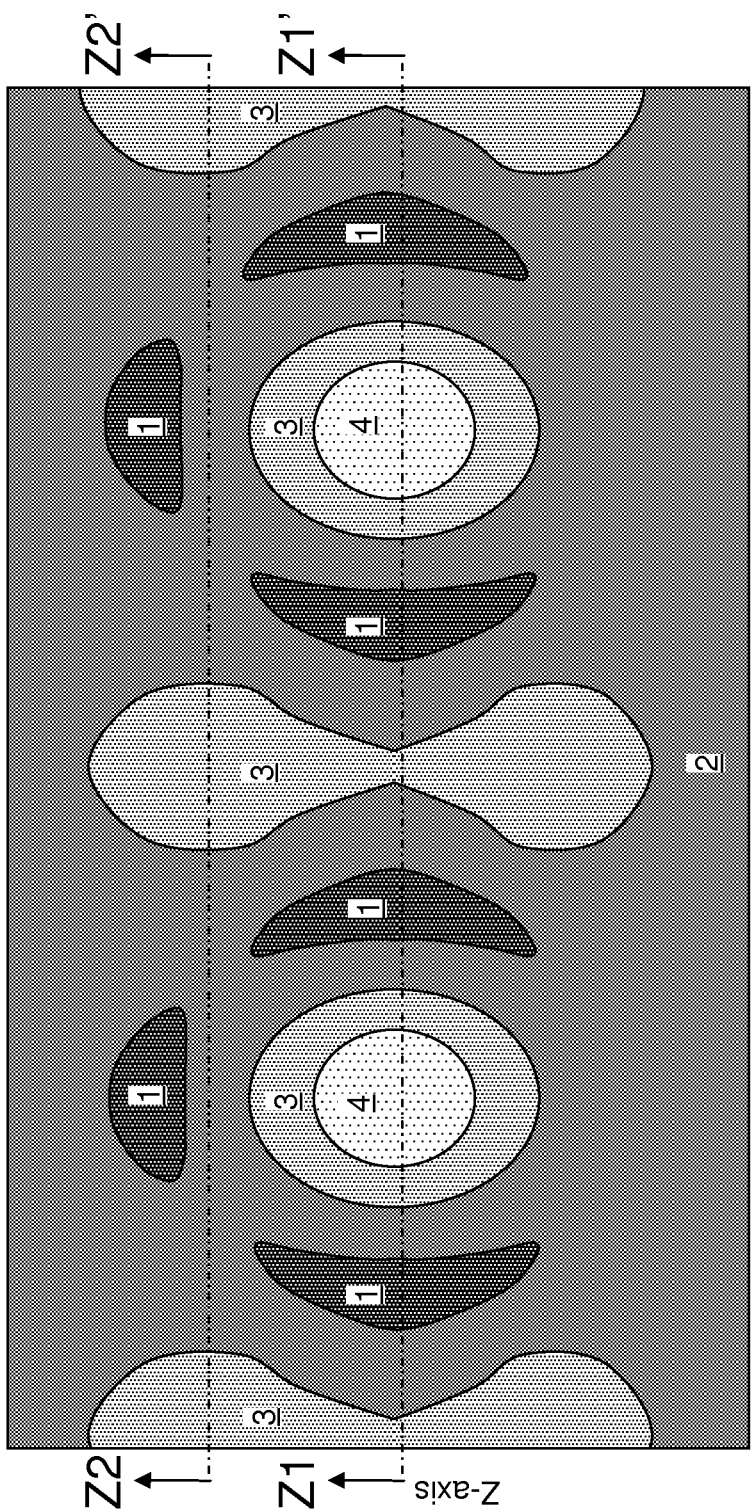
FIG. 6B is an equi-exposure contour plot of the intensity of illumination within the vertical plane A-A' of the photoresist in FIG. 6A.

This aspect is illustrated in FIGS. 6A and 6B. FIG. 6A is an equi-exposure contour plot of the intensity of illumination within a horizontal plane Z1-Z1' of FIG. 6B of a photoresist layer that is illuminated with light employing the lithographic mask of FIG. 3 and subsequently developed. FIG. 6B is an equi-exposure contour plot of the intensity of illumination within the vertical plane A-A' of the photoresist in FIG. 6A.

Regions labeled "1" are lowest exposure regions. Regions labeled "2" are below-average exposure regions that are exposed with greater light intensity than regions labeled "1" and with lesser light intensity than the volume average of light intensity over the entire volume of the (undeveloped) photoresist layer. Regions labeled "3" are above-average exposure regions that are exposed with greater light intensity than the volume average of light intensity over the entire volume of the photoresist layer. Regions labeled "4" are highest exposure regions that are exposed with greater light intensity than regions labeled "3."

As illustrated in FIG. 6B, even if the best focus plane was the same for both a main feature optical model and an SRAF printing optical model, the absorption in the photoresist layer would attenuate the intensity of SRAF features faster and only after a short distance from the top of the photoresist down, while main features would remain with a high intensity for longer distances, hence making the top of the photoresist the primary plane for testing SRAF printing. The same principle applies to a bright field process, where a minimum of intensity for the SRAFs would happen at the bottom of the photoresist.

In the illustrative example of FIG. 6B, the best focus plane is intentionally set at a horizontal plane around a mid-point between the top surface of a photoresist layer and a bottom surface of a photoresist layer. In this example, the maximum intensity for main features occurs near the best focus plane, which is the Z1-Z1' plane. However, the maximum intensity for potential SRAF printing, which corresponds to a dumbbell-shaped portions of regions labeled "3," occurs at a plane labeled Z2-Z2', which is vertically offset from the Z1-Z1' plane.

Thus, by intentionally selecting a second optimal point, such as the point "S" in FIGS. 4 and 5, within the two-dimensional definition range of the main feature best focus plane and the main feature image plane, for a selected value for the SRAF printing best focus plane for the purpose of calibrating the SRAF printing model, while selecting the most optimal point, such as the point "P" in FIGS. 4 and 5, for a selected value for the SRAF printing image plane for the purpose of calibrating the SRAF printing model, the impact of light intensity that can cause SRAF printing is simulated with higher intensity within the calibrated SRAF printing model. The impact of the higher light intensity of the simulated SRAF image that can cause SRAF printing, upon calibration employing the methods described above, provides enhanced accuracy of the calibrated SRAF printing model of the present disclosure.

In one embodiment, the value for the SRAF printing best focus plane can be determined by selecting a first point in a two-dimensional definition range of a best focus plane and an image plane. The first point is one of a set of equivalent optimum minimum of a root-mean-square (RMS) error function between measured CD values from the images and corresponding simulated CD values. For example, the first point can be the point "S" in FIGS. 4 and 5.

In one embodiment, the value for the SRAF printing image plane can be determined by selecting a second point in the two dimensional definition range. The second point can be, but is not limited to, one of the set of optimum minimum points of the RMS error function. For example, the second point can be the point "P" in FIGS. 4 and 5.

In one embodiment, the main feature best focus plane can be more proximal to a topmost portion of the photoresist top surface than a photoresist bottom surface, and the SRAF printing best focus plane can be more proximal to the photoresist bottom surface than to the topmost portion of the photoresist top surface. For example, the main feature best focus plane can be selected to correspond to the point "P" in FIG. 4 or FIG. 5, which is more proximal to a topmost portion of the photoresist top surface than a photoresist bottom surface. The SRAF printing best focus plane can be selected to correspond to the point "S" in FIG. 4 or FIG. 5, which is more proximal to the photoresist bottom surface than to the topmost portion of the photoresist top surface. In one embodiment, the main feature best focus plane can be located within 10% of a thickness of the patterned photoresist layer from the topmost portion of the photoresist top surface.

The method of calibrating the SRAF printing photoresist model as performed at step 160 is different from the method of calibrating the main feature photoresist model as performed at step 137 in the following aspects. First, the main feature photoresist model can be calibrated to photoresist CD measurements. In contrast, calibration of the SRAF printing photoresist model cannot be easily be measured by numbers. Thus, the SRAF printing photoresist model is calibrated by qualitatively comparing SEM images.

Second, the required output of the SRAF printing model can be in the form of binary results, i.e., printing or non-printing of each SRAF within a lithographic mask. The SRAF printing model may additionally provide, but does not require, accurate prediction of printed contours or CD values. However, prediction of printed contours of a developed photoresist and simulated CD values are required for the main feature model.

Third, while the SRAF printing model employs a pair of an optical model and a photoresist model, i.e., a pair of the SRAF printing optical model and the SRAF printing photoresist model, this pair is not necessarily the same pair as the pair of an optical model and a photoresist model for the main feature model, i.e., the pair of the main feature optical model and the main feature photoresist model. The SRAF printing optical model can employ a different best focus plane and/or a different image plane, i.e., the SRAF printing model best focus plane and the SRAF printing model image plane, than the best focus plane and the image plane of the main feature optical model, i.e., the main feature best focus plane and the main feature image plane, respectively. In addition, the SRAF printing photoresist model can use a different polynomial configuration than the main feature photoresist model, and can employ a CTR model.

If the SEM images of the patterned photoresist layer 40 are classified according to severity of the surface indentation due to SRAFs into at least two categories at step 122, a category value for the SRAF printing model best focus plane can be determined for each of the at least two categories. Each category value is obtained by evaluating only the SEM images within a same category of severity of surface indentation. In one embodiment, the value for the SRAF printing model best focus plane is determined by calculating a weighted average for the category values for the SRAF printing model best focus plane.

Likewise, if the SEM images of the patterned photoresist layer 40 are classified according to severity of the surface indentation due to SRAFs into at least two categories at step 122, a category value for the SRAF printing model image plane can be determined for each of the at least two categories. Each category value is obtained by evaluating only the SEM images within a same category of severity of surface indentation. In one embodiment, the value for the SRAF printing model image plane is determined by calculating a weighted average for the category values for the SRAF printing model image plane.

In one embodiment, an SRAF printing model can be calibrated (or verified) per category classified according to severity of the surface indentation in the following manner. An SRAF printing photoresist model including a constant threshold resist (CTR) model is separately estimated for each SEM image or SEM images grouped together because of similar severity classification, i.e., for each category classified according to severity of the surface indentation. The intensity value to be used with each CTR model is such that the SRAF printing would be predicted as close to each or group of SEM images as possible, at nominal condition of dose and focus at the wafer and at conditions other than the nominal conditions. Each SRAF printing photoresist model calibrated this way (for instance by estimating the threshold corresponding to each group of SRAF printing severity classification) can be assigned the specific severity classification of the calibrating group of SEM images.

In one embodiment, the SRAF printing photoresist model can be calibrated by assigning different weights to severity of the surface indentation depending on the deviation of the combination of focus and dose employed to generate each SEM image from the nominal focus and dose conditions. Specifically, the SRAF printing model can be independently calibrated for each combination of focus and dose conditions, resulting in different sets of parameters for each combination of focus and dose conditions. A greater weight can be assigned to the set of parameters for the nominal focus and dose conditions than to sets of parameters for non-nominal focus and dose conditions. Further, the weight to each individual non-nominal focus and dose conditions can be decreased in linear or non-linear proportion to the deviation of that non-nominal focus and dose conditions from the nominal focus and dose conditions.

Referring to step 170, the calibrated SRAF printing model can be employed to predict a printed image of, and/or to correct, a design pattern, e.g., a design layout of a semiconductor chip, including at least one SRAF. Specifically, the calibrated SRAF printing model can be applied to areas in a design pattern within the lithographic mask where SRAFs are present for at least one combination of focus and dose conditions, which is herein referred to as at least one second combination of focus and dose conditions. In one embodiment, the calibrated SRAF printing model can be applied to each mask shapes (design shapes) that are present within a lithographic mask.

The calibrated SRAF printing model is configured to predict occurrences of at least one printing SRAF upon inputting a design pattern to the calibrated SRAF printing model. Further, the calibrated SRAF printing model is configured to generate corrections to portions of the design pattern, wherein the corrections remove, or reduce a severity of, at least one of the occurrences of the at least one printing SRAF.

In one embodiment, at least one calibrated SRAF printing model calibrated to one category of SRAF printing severity is employed to predict occurrences of at least one printing SRAF upon inputting a design pattern to the calibrated SRAF printing model. The calibrated SRAF printing model used can be first the one corresponding to category of greatest severity SRAF printing and continue with the SRAF printing model for the category of immediately lower severity SRAF printing. The SRAF printing model is configured to generate corrections according to the weighted model predictions from at least one calibrated SRAF printing model for at least one category.

In one embodiment, at least one calibrated SRAF printing model calibrated at one category of focus and dose conditions is employed to predict the occurrences of at least one printing SRAF upon inputting a design pattern to the calibrated SRAF printing model. The calibrated SRAF printing model can first be the one corresponding to the category of focus and dose conditions with the highest severity weight and continue with the SRAF printing model for the category of focus and dose conditions of severity weight immediately lower. The SRAF printing model is configured to generate corrections according to the weighted model predictions from at least one calibrated SRAF printing model for at least one category of focus and dose conditions.

In one embodiment, the predictions from all calibrated SRAF printing models for all categories of SRAF printing severity can be combined according to the corresponding severity weights to produce a final SRAF printing probability estimate. The SRAF printing model is configured to generate corrections according to the SRAF printing probability estimate.

In one embodiment, an estimated outcome for SRAF printing for each of the at least two categories can be determined for an SRAF shape on a lithographic mask. Subsequently, a composite SRAF printing probability estimate can be determined based on a plurality of the determined estimated outcomes for SRAF printing for the SRAF shape.

In one embodiment, the predictions from all calibrated SRAF printing models for all categories of focus and dose conditions can be combined according to the corresponding severity weights to produce a final SRAF printing probability estimate. The SRAF printing model is configured to generate corrections according to the SRAF printing probability estimate.

In one embodiment, multiple calibrated intermediate SRAF printing models can be generated for each of the at least two categories. Subsequently, a composite SRAF printing probability estimate based on an weighted average of printing probability estimates from each of the multiple calibrated intermediate SRAF printing models.

Referring to step 180, SRAFs that produce an SRAF printing in a photoresist layer in a simulation are replaced with modified SRAFs to eliminate or reduce the SRAF printing in subsequent simulations. In addition, a modified design layout including the modified SRAFs is simulated with the main feature model to determine the printed shapes for the main features are within the specification. Correction is made to the main features in the design layout as needed.

Steps 170 and 180 may be repeatedly performed until predetermined criteria for images in simulated developed images are met. For example, the calibrated SRAF printing model and the main feature model are iteratively run as a pair until a predetermined percentage (e.g., 99.9%) of all main features in the design layout are reproduced within specification in a developed photoresist layer, while another predetermined percentage (e.g., 95%) of all SRAFs do not print.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A method of calibrating a sub-resolution assist feature (SRAF) printing model, said method comprising:

generating images of a patterned photoresist layer on a substrate, said patterned photoresist layer having a photoresist top surface that exhibits surface indentation due to presence of SRAFs in a lithographic mask for at least one first combination of focus and dose conditions;

calibrating an SRAF printing model against said images by determining a value for an SRAF printing best focus plane and by determining a value for an SRAF printing image plane;

classifying said images of said patterned photoresist layer according to severity of said surface indentation and into at least two categories;

generating multiple calibrated intermediate SRAF printing models for each of said at least two categories;

determining a composite SRAF printing probability estimate based on a weighted average of printing probability estimates from each of said multiple calibrated intermediate SRAF printing models; and applying, employing a machine configured to run an algorithm for said calibrated SRAF printing model on design patterns, said calibrated SRAF printing model to areas in a design pattern within said lithographic mask or another lithographic mask where SRAFs are present for at least one second combination of focus and dose conditions.

2. The method of claim 1, further comprising calibrating a main feature model employing a main feature best focus plane that is different from said SRAF printing best focus plane.

3. The method of claim 1, further comprising calibrating a main feature model employing a main feature image plane at which contours of said patterned photoresist layer are simulated for main features within said lithographic mask, wherein said SRAF printing best focus plane is different from said main feature best focus plane.

4. The method of claim 1, wherein said main feature best focus plane is more proximal to a topmost portion of said photoresist top surface than a photoresist bottom surface, and said SRAF printing best focus plane is more proximal to said photoresist bottom surface than to said topmost portion of said photoresist top surface.

5. The method of claim 4, wherein said main feature best focus plane is located within 10% of a thickness of said patterned photoresist layer from said topmost portion of said photoresist top surface.

6. The method of claim 1, wherein said images of a patterned photoresist layer are scanning electron microscopy (SEM) images of said patterned photoresist layer.

7. The method of claim 1, further comprising calibrating a main feature model with measurements on said images of said patterned photoresist layer.

8. The method of claim 7, wherein said main feature model is calibrated by determining a value for a main feature best focus plane and a value for a main feature image plane using measurements on printed main feature images among said images of said patterned photoresist layer.

9. The method of claim 8, wherein said measurements on said printed main feature images comprise at least one of a linewidth measurement and a spacing measurement.

10. The method of claim 7, wherein said SRAF printing model and said main feature model are calibrated employing a common photoresist model.

11. The method of claim 10, wherein said common photoresist model includes a polynomial with various terms, each containing a coefficient multiplying a basis function that describes at least one physical phenomenon of photoresist chemistry or a development process.

12. The method of claim 1, wherein said SRAF printing model is calibrated employing a constant threshold resist (CTR) model.

13. The method of claim 1, further comprising generate a sampling plan for data collection plan, wherein said sampling plan includes a subset of design data that is present within said lithographic mask and includes main features and SRAFs.

14. The method of claim 1, wherein said calibrated SRAF printing model is configured to predict occurrences of at least one printing SRAF upon inputting a design pattern to said calibrated SRAF printing model.

15. The method of claim 14, wherein said calibrated SRAF printing model is configured to generate corrections to portions of said design pattern, wherein said corrections remove, or reduce a severity of, at least one of said occurrences of said at least one printing SRAF.

16. A method of calibrating a sub-resolution assist feature (SRAF) printing model, said method comprising:
generating images of a patterned photoresist layer on a substrate, said patterned photoresist layer having a photoresist top surface that exhibits surface indentation due to presence of SRAFs in a lithographic mask for at least one first combination of focus and dose conditions;
calibrating an SRAF printing model against said images by determining a value for an SRAF printing best focus plane and by determining a value for an SRAF printing image plane;
classifying said images of said patterned photoresist layer according to severity of said surface indentation and into at least two categories;
determining, for an SRAF shape on a mask, an estimated outcome for SRAF printing for each of said at least two categories;
determining a composite SRAF printing probability estimate based on a plurality of said determined estimated outcomes for SRAF printing for said SRAF shape; and
applying, employing a machine configured to run an algorithm for said calibrated SRAF printing model on design patterns, said calibrated SRAF printing model to areas in a design pattern within said lithographic mask or another lithographic mask where SRAFs are present for at least one second combination of focus and dose conditions.

17. The method of claim 16, further comprising:
generating multiple calibrated intermediate SRAF printing models for each of said at least two categories; and
determining a composite SRAF printing probability estimate based on an weighted average of printing probability estimates from each of said multiple calibrated intermediate SRAF printing models.

18. A method of calibrating a sub-resolution assist feature (SRAF) printing model, said method comprising:
generating images of a patterned photoresist layer on a substrate, said patterned photoresist layer having a photoresist top surface that exhibits surface indentation due to presence of SRAFs in a lithographic mask for at least one first combination of focus and dose conditions;
calibrating an SRAF printing model against said images by determining a value for an SRAF printing best focus plane and by determining a value for an SRAF printing image plane, wherein said value for said SRAF printing best focus plane is determined by selecting a first point in a two-dimensional definition range of a best focus plane and an image plane, and said second point is a global minimum of said RMS error function, and said first point is a local minimum of a root-mean-square (RMS) error function between measured CD values from said images and corresponding simulated CD values, and said first point is not a global minimum of said RMS error function; and
applying, employing a machine configured to run an algorithm for said calibrated SRAF printing model on design patterns, said calibrated SRAF printing model to areas in a design pattern within said lithographic mask or another lithographic mask where SRAFs are present for at least one second combination of focus and dose conditions.

19. The method of claim 18, wherein said value for said SRAF printing image plane is determined by selecting a second point in said two dimensional definition range, and said second point is a global minimum of said RMS error function.

20. The method of claim 18, further comprising:
classifying said images of said patterned photoresist layer according to severity of said surface indentation and into at least two categories;
generating multiple calibrated intermediate SRAF printing models for each of said at least two categories; and
determining a composite SRAF printing probability estimate based on a weighted average of printing probability estimates from each of said multiple calibrated intermediate SRAF printing models.

\* \* \* \* \*